United States Patent
Inaba

(10) Patent No.: US 8,039,843 B2
(45) Date of Patent: Oct. 18, 2011

(54) SEMICONDUCTOR WAFER, SEMICONDUCTOR DEVICE AND METHOD OF FABRICATING THE SAME

(75) Inventor: Satoshi Inaba, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 484 days.

(21) Appl. No.: 12/192,461

(22) Filed: Aug. 15, 2008

(65) Prior Publication Data

US 2009/0072276 A1    Mar. 19, 2009

(30) Foreign Application Priority Data

Aug. 24, 2007    (JP) ................. 2007-218459

(51) Int. Cl.
*H01L 29/04*    (2006.01)
(52) U.S. Cl. .... 257/64; 257/327; 257/328; 257/E21.014
(58) Field of Classification Search .................. None
See application file for complete search history.

(56) References Cited

U.S. PATENT DOCUMENTS

| | | | |
|---|---|---|---|
| 6,525,403 B2 | 2/2003 | Inaba et al. | |
| 6,794,718 B2 | 9/2004 | Nowak et al. | |
| 7,023,055 B2 | 4/2006 | Ieong et al. | |
| 7,023,057 B2 | 4/2006 | Ieong et al. | |
| 2004/0075141 A1 | 4/2004 | Maeda et al. | |
| 2005/0224875 A1 | 10/2005 | Anderson et al. | |
| 2006/0027870 A1 | 2/2006 | Inaba | |
| 2007/0190708 A1* | 8/2007 | Kaneko et al. | 438/157 |
| 2007/0221956 A1 | 9/2007 | Inaba | |

FOREIGN PATENT DOCUMENTS

| | | |
|---|---|---|
| JP | 5-90117 | 4/1993 |
| JP | 2004-140148 | 5/2004 |
| JP | 2005-136410 | 5/2005 |
| JP | 2005-166865 | 6/2005 |
| JP | 2005-294828 | 10/2005 |
| WO | WO 2005/124871 A2 | 12/2005 |

OTHER PUBLICATIONS

B. Doris, et al, "A Simplified Hybrid Orientation Technology (SHOT) for High Performance CMOS", IEEE Symposium on VLSI Technology Digest of Technical Papers, 2004, pp. 86-87.

* cited by examiner

*Primary Examiner* — Evan Pert
*Assistant Examiner* — Scott R Wilson
(74) *Attorney, Agent, or Firm* — Oblon, Spivak, McClelland, Maier & Neustadt, L.L.P.

(57) ABSTRACT

A semiconductor substrate according to an embodiment includes: a first semiconductor wafer having a first crystal; and a second semiconductor wafer formed of a second crystal substantially same as the first crystal on the first semiconductor wafer, a crystal-axis direction of unit cell thereof being twisted at a predetermined angle around a direction vertical to a principal surface of the second semiconductor wafer from that of the first semiconductor wafer.

9 Claims, 12 Drawing Sheets

SEMICONDUCTOR WAFER, SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2007-218459, filed on Aug. 24, 2007, the entire contents of which are incorporated herein by reference.

BACKGROUND

In a structure of a fin-type FET (Field Effect Transistor) (hereinafter referred to as "FinFET"), it is possible to provide several channel plane directions by setting a crystal plane direction and a channel direction of a substrate. Furthermore, it is known that an optimal channel direction with respect to a crystal axis to improve carrier mobility is different between an n-type FinFET and a p-type FinFET. For example, in general, both of the n-type and p-type FinFETs are often configured so that a plane direction of a fin side surface is (100) and an axial direction of a channel region formed on the fin side surface is <110>, however, it has been known that the carrier mobility is improved by configuring the plane direction of the fin side surface to be (100) and the axial direction of the channel region formed on the fin side surface to be <100> for the n-type FinFET while configuring the plane direction of the fin side surface to be (110) and the axial direction of the channel region formed on the fin side surface to be <110> for the p-type FinFET.

A technique to form one conductivity type of FinFET inclined at 45° with respect to another conductivity type of FinFET around a height direction so as to make plane directions and channel directions of fin side surfaces of both n-type and p-type FinFETs to be directions which improve the carrier mobility as described above when mounting the n-type and p-type FinFETs together on a Si substrate of which plane direction of one principal surface is (100), is known. This technique, for example, is disclosed in a non-patent literary document of B. Doris et al., Symp. on VLSI Tech. Dig. of Tech. Papers, pp. 86-87, 2004.

Meanwhile, a technique, to give different crystal directions to an n-type and p-type device regions on the same substrate, in which semiconductor substrates having different plane directions are laminated, and then, a predetermined region of the upper substrate recrystallized so as to reflect a plane direction of the lower substrate after amorphizing the predetermined region of the upper substrate, is known. This technique, for example, is disclosed in U.S. Pat. No. 7,023,055.

BRIEF SUMMARY

A semiconductor substrate according to one embodiment includes: a first semiconductor wafer having a first crystal; and a second semiconductor wafer formed of a second crystal substantially same as the first crystal on the first semiconductor wafer, a crystal-axis direction of unit cell thereof being twisted at a predetermined angle around a direction vertical to a principal surface of the second semiconductor wafer from that of the first semiconductor wafer.

A semiconductor device according to another embodiment includes: a semiconductor substrate; a first transistor formed on the semiconductor substrate and having a first fin; and a second transistor formed on the semiconductor substrate and having a second fin of which plane direction of the upper surface is identical to that of the first fin, a channel direction in the second fin with respect to a crystal axis of the side surface portion of the second fin being different from a channel direction in the first fin with respect to a crystal axis of the side surface portion of the first fin, and a direction in which the second fin is arranged being substantially parallel or vertical to a direction in which the first fin is arranged within a plane parallel to a surface of the semiconductor substrate.

A method of fabricating a semiconductor device according to another embodiment includes: laminating a second substrate, of which plane direction of the principal surface is same as that of a first substrate, on the first substrate in the state that the crystal-axis directions in the principal surfaces of the first and second substrates are at a predetermined angle around a direction vertical to the principal surface to each other, forming first and second fins by patterning the second substrate, selectively amorphizing the first fin; and substantially matching the crystal-axis direction of the unit cell of the first fin to that of the first substrate by recrystallizing the amorphized first fin using the first substrate as a base.

DETAILED DESCRIPTION

First Embodiment

Figure 1:
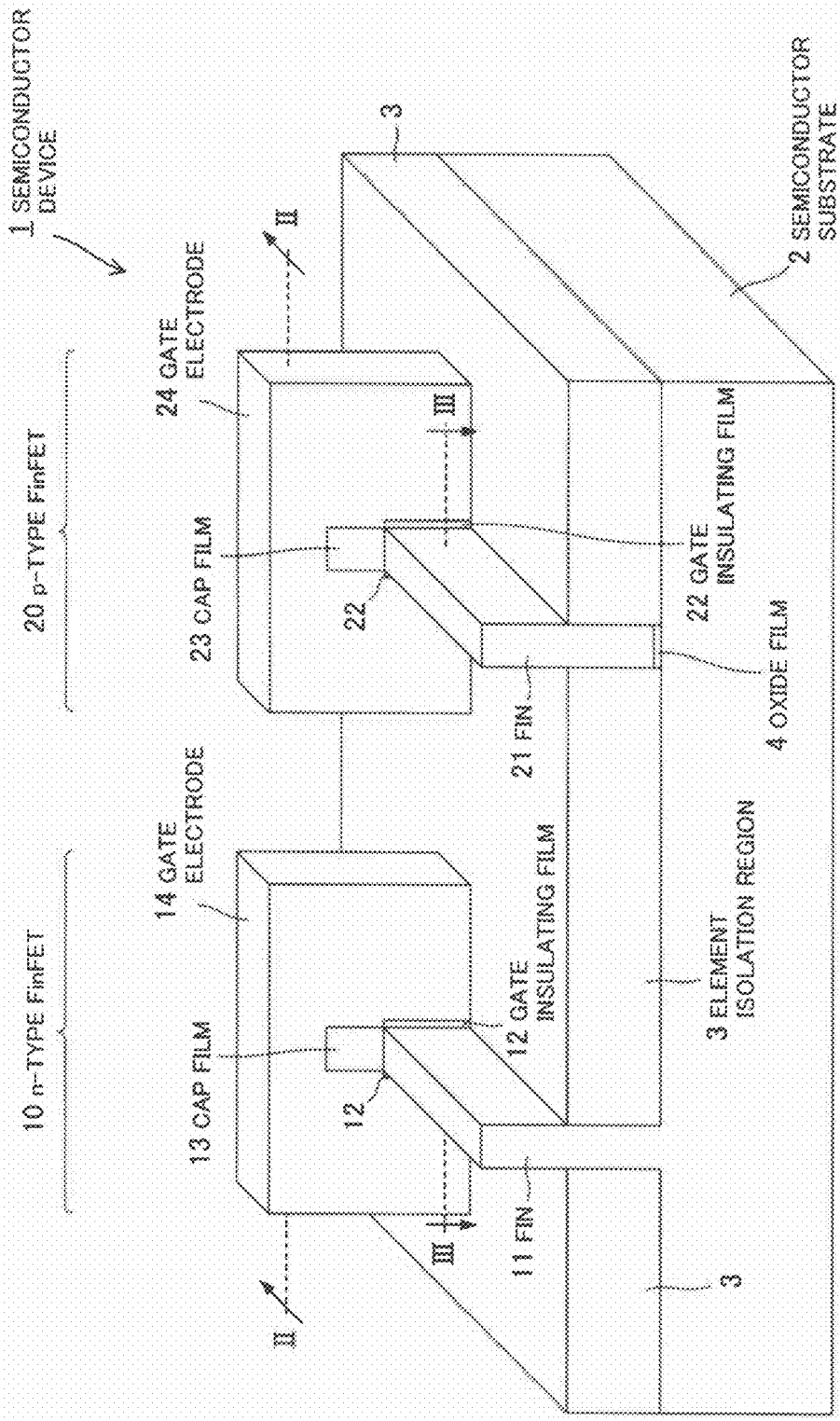
FIG. 1 is a perspective view of a semiconductor device according to a first embodiment.
Figure 2:
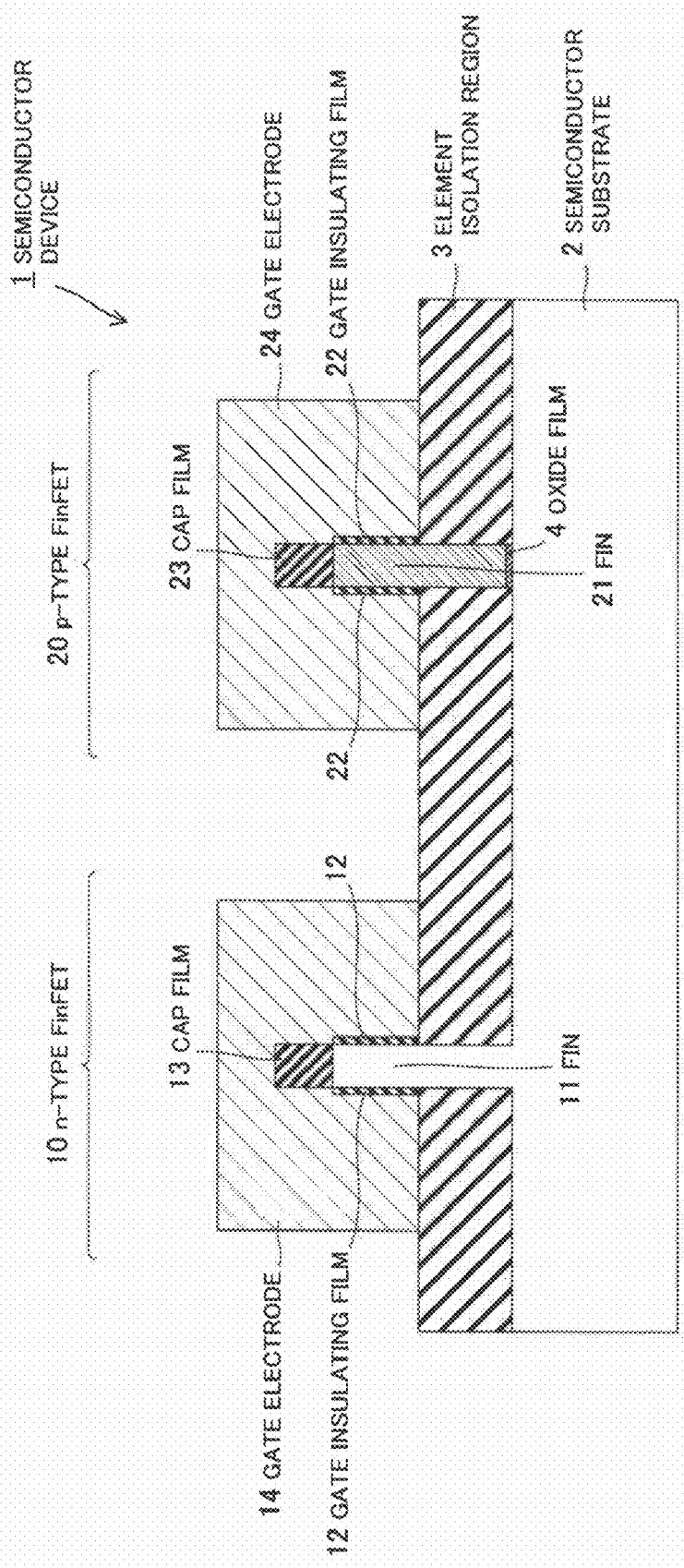
FIG. 2 is a cross sectional view of the semiconductor device according to the first embodiment when a cut surface taken on line II-II of FIG. 1 is viewed in a direction indicated by an arrow in the figure.
Figure 3:
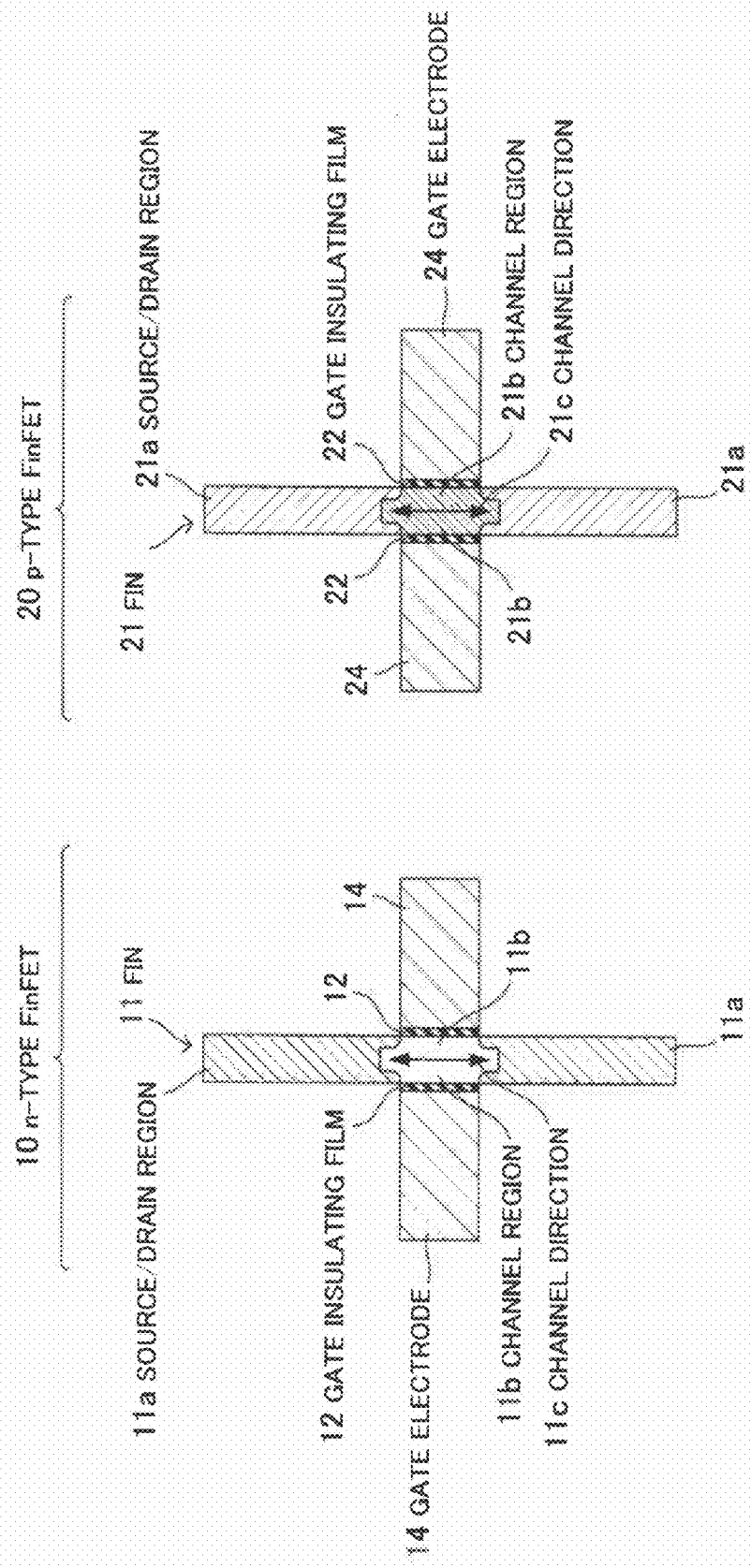
FIG. 3 is a cross sectional view of the semiconductor device according to the first embodiment when a cut surface taken on line III-III of FIG. 1 is viewed in a direction indicated by an arrow in the figure.

FIG. 1 is a perspective view of a semiconductor device according to a first embodiment. Furthermore, FIG. 2 is a cross sectional view when a cut surface taken on line II-II of FIG. 1 is viewed in a direction indicated by an arrow in the figure. Furthermore, FIG. 3 is a cross sectional view when a cut surface taken on line III-III of FIG. 1 is viewed in a direction indicated by an arrow in the figure.

A semiconductor device 1 schematically has a n-type FinFET 10 and a p-type FinFET 20 formed on a semiconductor substrate 2 and a device isolation region 3 for electrically isolating the n-type FinFET 10 and the p-type FinFET 20. Note that, instead of the n-type FinFET 10 and the p-type FinFET 20, tri-gate transistors in which a channel region is formed on both side faces and an upper surface of a fin may be used.

The n-type FinFET 10 and the p-type FinFET 20 include fins 11 and 21 formed on the semiconductor substrate 2, and gate electrodes 14 and 24 formed so as to sandwich both side faces of the fins 11 and 21 between their opposite portions via gate insulating films 12 and 22, respectively. Furthermore, cap films 13 and 23 are formed between the gate electrodes 14 and 24 and the upper surfaces of the fins 11 and 21. In addition, an oxide film 4 is formed between the fin 21 and the semiconductor substrate 2. Source/drain regions 11a and 21a are formed in regions which sandwich the gate electrodes 14 and 24 in the fins 11 and 21, respectively and channel regions 11b and 21b are formed in regions sandwiched by the source/drain regions 11a and 21a in the fins 11 and 21. Note that, illustrations of the source/drain regions 11a and 21a and the channel regions 11b and 21b are omitted in FIG. 1 and FIG. 2.

Furthermore, a punch-through stopper may be formed in a region located substantially below the upper surface of the device isolation region 3 in the fins 11 and 21 even though it is not illustrated. Gate sidewall spacers or offset spacers may be formed on the side faces of the gate electrodes 14 and 24, respectively even though they are not illustrated.

For the semiconductor substrate 2, for example, it is possible to use a Si-based substrate comprising a crystal mainly composed of Si such as a Si substrate or the like, of which plane direction of the principal surface is {100}. Note that, {100} represents (100) and a plane direction equivalent to (100).

The device isolation region 3 comprises, for example, an insulating material such as $SiO_2$ or the like, and has a STI (Shallow Trench Isolation) structure.

For the fin 11 of the n-type FinFET 10, it is preferable that the plane direction of the side face is {100} and a channel direction 11c of the channel region 11b formed on the side face is <100> for the reason for improving mobility of an electron which is a carrier. Note that, <100> represents [100] and a direction equivalent to [100]. Furthermore, a crystal-axis direction of the unit cell of a crystal composing the fin 11 substantially matches that of a crystal comprising the semiconductor substrate 2.

For the fin 21 of the p-type FinFET 20, it is preferable that the plane direction of the side face is {110} and a channel direction 21c of the channel region 21b formed on the side face is <110> for the reason for improving mobility of a hole which is a carrier. Note that, <110> represents [110] and an axial direction equivalent to [110]. Furthermore, a crystal-axis direction of the unit cell of a crystal composing the fin 21 and that of a crystal composing the semiconductor substrate 2 are mismatched at a predetermined angle θ around a direction vertical to the side face of the semiconductor substrate 2. This predetermined angle θ is preferably $\theta = (45 + 90 \times n)°$ (n is an integer number).

Furthermore, it is preferable that channel directions 11c and 21c in the fins 11 and 21 are formed substantially parallel or vertical to each other within a plane parallel to the surface of the semiconductor substrate 2 for the convenience of the layout or the like of devices on the semiconductor substrate 2. Furthermore, it is preferable that the fins 11 and 21 have a sufficient height in order to prevent the source/drain region 21a formed inside the fin 21 from being formed to a position below the oxide film 4. It is because a current path is formed below the channel region 21b which is governed by the gate insulating film 22 and a punch-through is possibly generated if the source/drain region 21a is formed to a position below the oxide film 4.

Furthermore, the fins 11 and 21 are composed of a crystal which is substantially identical to the crystal composing the semiconductor substrate 2. Here, "substantially identical" means that those crystals are identical if parent crystals (Si crystal, etc.) are identical, unless axial angles of the unit cell or the like vary greatly, even if the contained amounts of the impurity atom or the like are different.

The gate insulating films 12 and 22 are composed of, for example, $SiO_2$, SiN, SiON, or a high-k material (for example, an Hf-based material such as HfSiON, HfSiO or HfO, a Zr-based material such as ZrSiON, ZrSiO or ZrO, and a Y-based material such as $Y_2O_3$).

The cap films 13 and 23 are composed of, for example, an insulating material such as SiN or the like. Note that, when the n-type FinFET 10 and the p-type FinFET 20 are tri-gate transistors, the cap films 13 and 23 are not provided, the gate insulating films 12 and 22 are provided also on the upper surface of the fins 11 and 21, respectively, and the channel regions 11b and 21b are formed also in the upper surface of the fins 11 and 21.

The gate electrodes 14 and 24 are composed of, for example, polycrystalline silicon containing a conductivity type impurity or polycrystalline silicon germanium containing a conductivity type impurity. In terms of the conductivity type impurity, a p-type impurity ion such as B, $BF_2$, In or the like is used for a p-type transistor and an n-type impurity ion such as As, P or the like is used for an n-type transistor. Note that, silicide layers may be formed on the surfaces of the gate electrodes 14 and 24. Furthermore, the gate electrodes 14 and 24 may be composed of fully silicided gate electrode, of which whole region is silicided. Furthermore, the gate electrodes 14 and 24 may be a metal gate electrode composed of W, Ta, Ti, Hf, Zr, Ru, Pt, Ir, Mo, Al or the like or a compound thereof, or may have a laminated structure of a metal gate electrode portion and a polysilicon electrode portion.

An example of the processes for fabricating the semiconductor device 1 according to this embodiment will be described hereinafter.

FIGS. 4A to 4K are cross sectional views showing processes for fabricating the semiconductor device according to the first embodiment. Note that, the cross sections shown in these figures correspond to the cross section shown in FIG. 2.

Figure 4A:
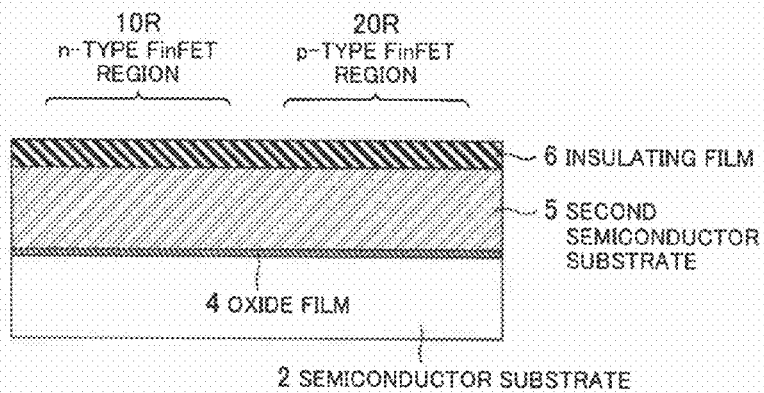
FIGS. 4A to 4K are cross sectional views showing processes for fabricating the semiconductor device according to the first embodiment.

Firstly, as shown in FIG. 4A, a second semiconductor substrate 5 is laminated on the semiconductor substrate 2 and an insulating film 6 is formed thereon. Here, the second semiconductor substrate 5 is composed of a crystal which is substantially identical to the crystal composing the semiconductor substrate 2, for example, a Si crystal. Furthermore, in the second semiconductor substrate 5, the plane direction of the principal surface is identical to that of the semiconductor substrate 2 and the crystal-axis direction of the unit cell is at a predetermined angle θ around a direction vertical to the surface thereof with that of the semiconductor substrate 2. Especially, it is preferable that the plane directions of the principal surfaces of the semiconductor substrate 2 and the second semiconductor substrate 5 are {100} and $\theta = (45 + 90 \times n)°$ (n is an integer number).

For laminating the semiconductor substrate 2 and the second semiconductor substrate 5, it is possible to use a method to form hydrophilic bonding between the semiconductor substrate 2 and the second semiconductor substrate 5 under low temperature or a method to form hydrophobic bonding between the semiconductor substrate 2 and the second semiconductor substrate 5 under high temperature. Note that, since it is difficult to match the crystal lattice neatly in order of atomic size even if the plane directions of the substrates are same, the oxide film 4 which is an ultrathin film is often formed partially on the interface between the semiconductor substrate 2 and the second semiconductor substrate 5 when laminating the semiconductor substrate 2 and the second semiconductor substrate 5. The following explanation describe the case that the oxide film 4 is formed. However the explanation will be applied to the case that the oxide film 4 is not formed.

Furthermore, since the heights of the fins 11 and 21 are determined by the thickness of the second semiconductor substrate 5, the second semiconductor substrate 5 is required to have sufficient thickness in order to prevent the source/drain region formed in the fin 21 from being formed below the oxide film 4 in the posterior process. On the other hand, if the thickness of the second semiconductor substrate 5 is excessive, it becomes difficult to recrystallize the fin 11 using the semiconductor substrate 2 as a base in the posterior process. Concretely, for example, when the height of the fin 21 from the surface of the device isolation region 3 is 100 nm, the thickness of the second semiconductor substrate 5 is 200 nm.

Following method is used for adjusting an in-plane angle of the substrate when laminating the semiconductor substrate 2 and the second semiconductor substrate 5. For example, substrates in which marks indicating directions of the crystal such as notches, orientation flats or the like are provided in a direction preliminarily located at an angle θ to each other are used as the semiconductor substrate 2 and the second semiconductor substrate 5, and are laminated with aligning (matching) the positions of the notches or the like of the semiconductor substrate 2 and the second semiconductor substrate 5. Concretely, it is possible to use a substrate, of which the plane direction of the principal surface is {100} and a notch or the like is formed in a <100> direction of the principal surface, as the semiconductor substrate 2 and a substrate, in which the {100} plane direction of the principal surface is {100} and a notch or the like is formed in a <110> direction of the principal surface, as the second semiconductor substrate 5, and laminate the semiconductor substrate 2 and the second semiconductor substrate 5 with aligning the positions of the notches or the like thereof.

Furthermore, it may use the same substrates, in which the notches or the like are provided in the same direction, as the semiconductor substrate 2 and the second semiconductor substrate 5, and laminate the semiconductor substrate 2 and the second semiconductor substrate 5 with rotating the positions of the notches or the like at an angle θ to each other. Concretely, it is possible to use the substrates, in which the plane directions of the principal surfaces are {100} and a notches are formed in <100> directions or <110> directions of the principal surfaces, as the semiconductor substrate 2 and the second semiconductor substrate 5, and laminate the semiconductor substrate 2 and the second semiconductor substrate 5 with rotating the portions of the notches or the like at 45° to each other. Note that, when conducting a fine alignment of the angle at the time of lamination of both wafers, a method to laminate with aligning the position of the notch of the semiconductor substrate 2 is advantageous.

Furthermore, the insulating film 6 is composed of an insulating material such as SiN or the like and is formed by a CVD (Chemical Vapor Deposition) method or the like.

Note that, after the second semiconductor substrate 5 is formed on the semiconductor substrate 2, a bonded wafer (substrate) is obtained.

Figure 4B:
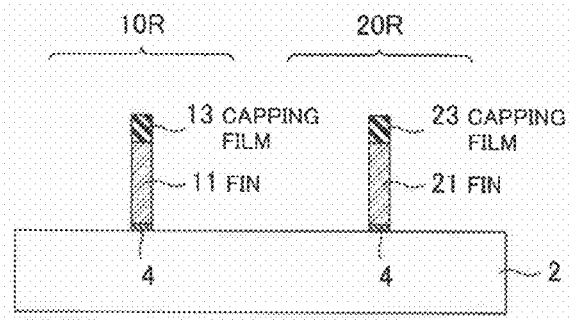

Next, as shown in FIG. 4B, for example, the cap film 13, the fin 11 and the oxide film 4 are formed in an n-type FinFET region 10R and the cap film 23, the fin 21 and the oxide film 4 are formed in a p-type FinFET region 20R, respectively by patterning the insulating film 6, the second semiconductor substrate 5 and the oxide film 4 by photolithography and RIE (Reactive Ion Etching). Note that, since the oxide film 4 functions as an etching stopper at this time, it is possible to prevent over-etching of the semiconductor substrate 2.

At this stage, both plane directions of the side faces of the fins 11 and 21 are {110} and both channel directions 11c and 21c are <110>. For example, when the substrate, of which the plane direction of the principal surface is {100} and the notch is formed in <110> direction of the principal surface, is used as the second semiconductor substrate 5, the fins 11 and 21 are formed to be parallel in a direction of the notch of the second semiconductor substrate 5.

Figure 4C:
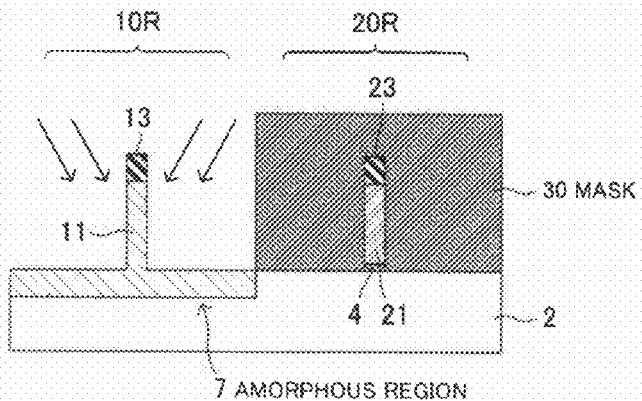

Next, as shown in FIG. 4C, after forming a mask 30 on the p-type FinFET region 20R, an impurity is selectively implanted to the n-type FinFET region 10R and the area where the impurity has been implanted is amorphized, which results in that an amorphous region 7 is formed. Here, an impurity ion, which has relatively heavy mass enabling a Si crystal to be amorphized but does not become a conductivity type impurity, such as Ge or the like is used for implanting. Furthermore, the impurity ion is implanted with energy and a dose amount which allow the area to be sufficiently amorphized by implanting the impurity ion and prevent damage from generating at an area to be amorphized. Furthermore, the impurity ion is preferably implanted at a predetermined angle with respect to the surface of the semiconductor substrate 2. If implanting vertically with respect to the surface of the semiconductor substrate 2, it is necessary to implant the impurity ion to the fin 11 penetrating through the cap film 13 with high energy, which greatly damages the semiconductor substrate 2 or the like.

Figure 4D:
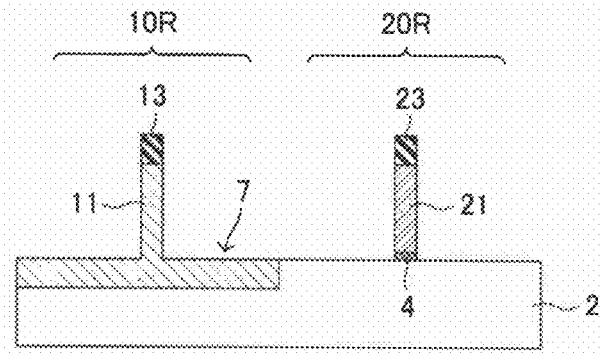

Next, as shown in FIG. 4D, the mask 30 on the p-type FinFET region 20R is removed.

Figure 4E:
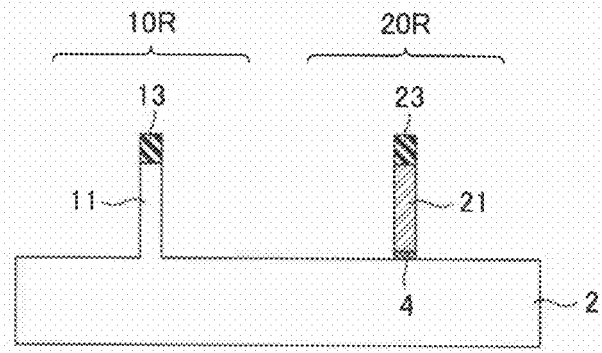

Next, as shown in FIG. 4E, the amorphous region 7 is recrystallized by annealing treatment. Here, since the recrystallization occurs using the semiconductor substrate 2 as a base, the crystal-axis direction of the unit cell of the crystal of the fin 11 matches that of the semiconductor substrate 2. Note that, the annealing treatment is conducted under moderate conditions, for example, at 550° C. for one hour or the like since the shape of the crystal of the fin 11 changes due to the migration of the crystal of the fin 11 if the temperature is too high or the period of treatment is too long. Note that, as shown in FIG. 4E, it is preferable that the oxide film 4 in the n-type FinFET region 10R is destroyed and the region where the oxide film 4 was formed is recrystallized during the above-mentioned formation of the amorphous region 7 and a series of processes for recrystallizing.

Figure 4F:
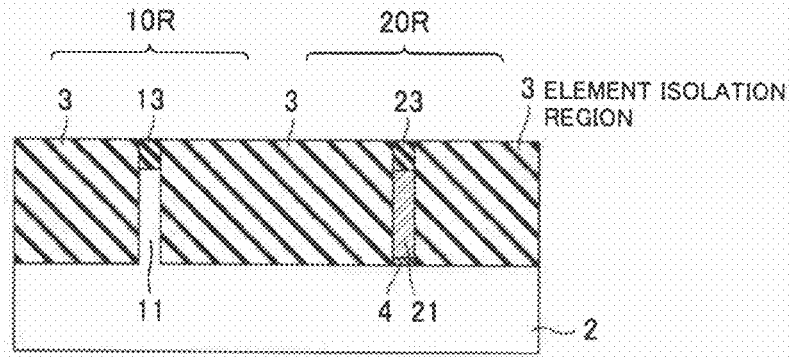

Next, as shown in FIG. 4F, after depositing a $SiO_2$ film or the like by the CVD method or the like, the device isolation region 3 is formed by planarizing this deposited film by CMP (Chemical Mechanical Polishing) using the upper surface of the cap films 13 and 23 as a stopper.

Figure 4G:
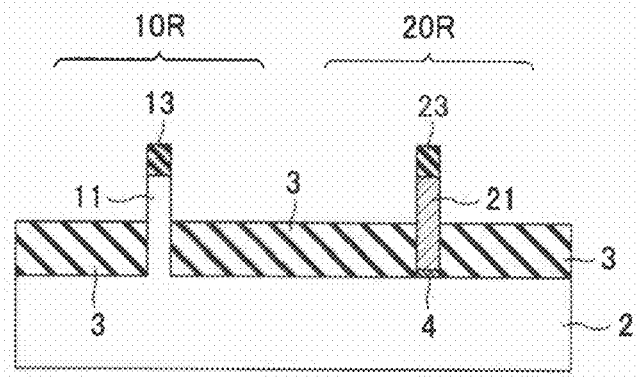

Next, as shown in FIG. 4G, the planarized device isolation region 3 is etched back up to a predetermined height. For example, when the height of the fins 11 and 21 from the surface of the semiconductor substrate 2 is 200 nm, the device isolation region 3 is 100 nm.

Figure 4H:
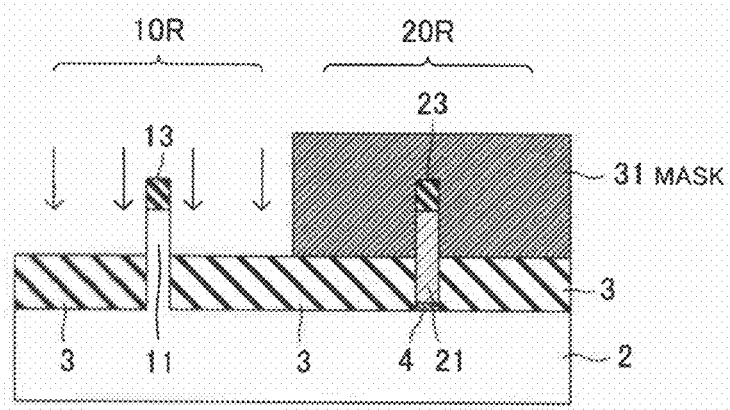

Next, as shown in FIG. 4H, a conductivity type impurity ion is implanted to the n-type FinFET region 10R by an ion implantation procedure after forming a mask 31 on the p-type FinFET region 20R, which results in that a punch-through stopper (not shown) is formed in a region located substantially below the upper surface of the device isolation region 3 of the fin 11. Here, a p-type impurity ion such as B, $BF_2$, In or the like is used for the conductivity type impurity.

Concretely, a punch-through stopper is formed by following method. A conductivity type impurity is implanted to the n-type FinFET region 10R from a direction vertical to the surface of the semiconductor substrate 2 and so as to be implanted to the device isolation region 3. The conductivity type impurity implanted to the device isolation region 3 is scattered through a large angle and the conductivity type impurity scattered in a transverse direction is diffused into the fin 11, which results in that a punch-through stopper is formed. Note that, since the conductivity type impurity is implanted from a direction vertical to the surface of the semiconductor substrate 2, the conductivity type impurity is hardly implanted to the fin 11 directly, and the punch-through stopper is formed only in a region located substantially below the upper surface of the device isolation region 3 by the conductivity type impurity implanted via device isolation region 3.

Figure 4I:
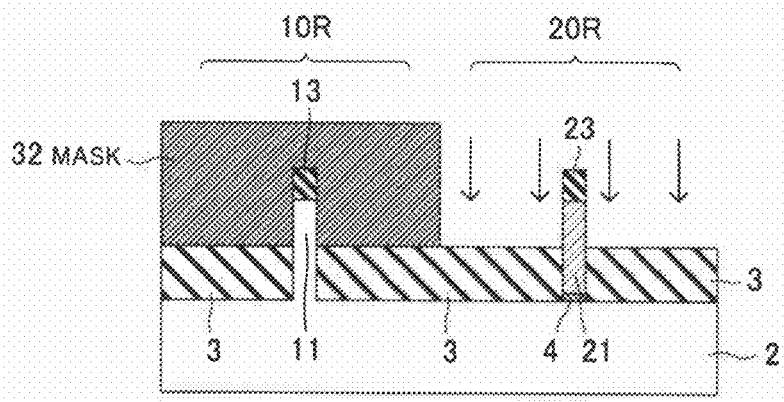

Next, as shown in FIG. 4I, a conductivity type impurity ion is implanted to the p-type FinFET region 20R by an ion implantation procedure after forming a mask 32 on the n-type FinFET region 10R, which results in that a punch-through stopper (not shown) is formed in a region located substantially below the upper surface of the device isolation region 3 of the fin 21. Here, an n-type impurity ion such as As, P or the like is used for the conductivity type impurity ions. A formation method of the punch-through stopper is same as that in the fin 11.

Figure 4J:
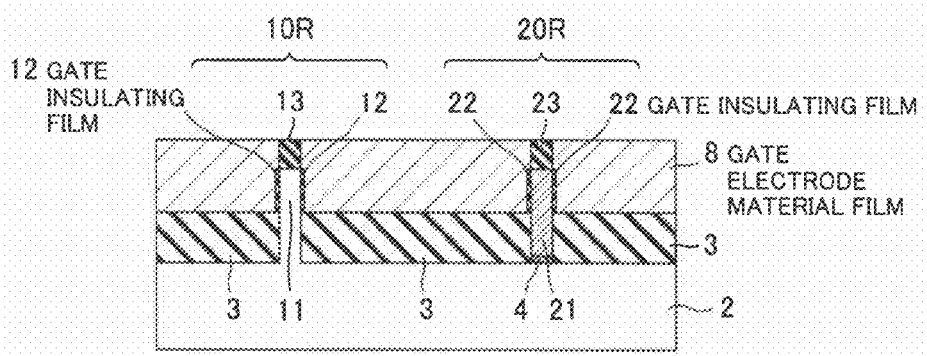

Next, as shown in FIG. 4J, after forming the gate insulating films 12 and 22 on the side faces of the fins 11 and 21, a gate electrode material film 8 is deposited on the semiconductor substrate 2 by the CVD method or the like and is planarized by the CMP using the upper surface of the cap films 13 and 23 as a stopper.

Concretely, the gate insulating films 12 and 22 are formed by following method. For example, the gate insulating films 12 and 22 are formed by oxidation of the side face of the fins 11 and 21 in case of using a $SiO_2$ film as the gate insulating films 12 and 22, and by nitridation or oxynitridation after oxidation of the side face of the fins 11 and 21 in case of using a SiON film. Furthermore, when using a SiN film, a high-k material film or the like as the gate insulating films 12 and 22, the gate insulating films 12 and 22 may be formed by removing an unnecessary portion after depositing the SiN film, the high-k material film or the like on the whole surface of the semiconductor substrate 2 by the CVD method or the like.

Figure 4K:
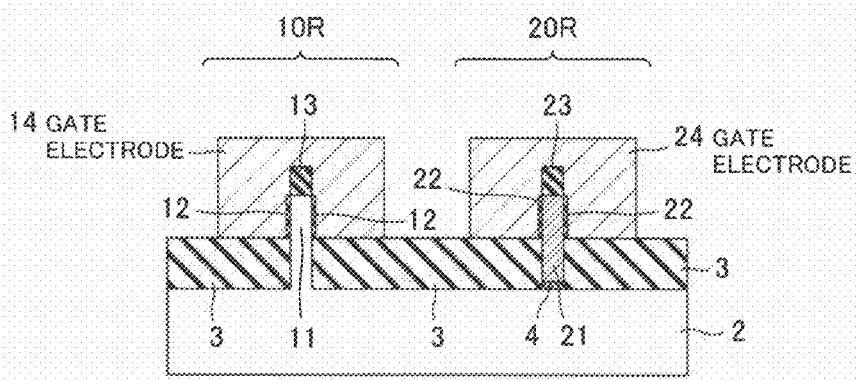

Next, as shown in FIG. 4K, for example, the gate electrode material film 8 is patterned by the photolithography and the RIE, and then, processed into the gate electrodes 14 and 24. After that, regions of the cap films 13, 23 and the gate insulating films 12 and 22 which are not surrounded by the gate electrodes 14 and 24 are removed by etching.

After that, although it is not shown in the figures, the conductivity type impurity ion is implanted to the fins 11 and 21 using the gate electrodes 14 and 24 as a mask to form extension regions of the source/drain regions 11a and 21a in the fins 11 and 21, respectively. Here, an n-type impurity is implanted to the fin 11 to form an n-type extension region. Meanwhile, a p-type impurity is implanted to the fin 21 to form a p-type extension region. After that, the conductivity type impurity ions in the n-type and p-type extension regions are activated by applying activation annealing.

Next, gate sidewalls are formed on the side faces of the gate electrodes 14 and 24, respectively. Next, the conductivity type impurity is implanted to the fins 11 and 21 by an ion implantation procedure or the like using the gate electrodes 14 and 24 and the gate sidewalls on the side faces thereof as a mask, which results in that the source/drain regions 11a and 21a are formed in the fins 11 and 21, respectively. Here, the conductivity type impurity having the same conductivity type as the one used for forming the extension region is used. After that, the conductivity type impurity in the source/drain regions 11a and 21a are activated by applying another activation annealing.

Note that, the source/drain regions 11a and 21a are temporarily amorphized since they are formed by an ion implantation. As a result, if the heights of the fins 11 and 21 are not sufficient and the source/drain regions 11a and 21a are located near the semiconductor substrate 2, during the heat treatment after the ion implantation, there is a risk that the source/drain regions 11a and 21a are recrystallized using the second semiconductor substrate 5 as a base and the crystal-axis direction of the unit cell of the fin 21 may possibly match that of the semiconductor substrate 2 just like the fin 11. Therefore, the fins 11 and 21 are preferably formed so as to have a sufficient height with respect to the depth of the source/drain regions 11a and 21a in the height direction of the fins 11 and 21.

Next, a silicide layer is formed on the upper surfaces of the gate electrodes 14 and 24 and the surfaces of the fins 11 and 21 by depositing a metal film on the semiconductor substrate 2 and applying heat treatment.

According to the first embodiment, the semiconductor device 1 having the n-type FinFET 10 and the p-type FinFET 20, which have an optimal channel direction with respect to the crystal axis in order to improve the carrier mobility and enable to be formed in a preferable layout, on the same substrate (which is semiconductor substrate 2) can be formed.

The preferable layout is that, for example, the n-type FinFET 10 and the p-type FinFET 20 are parallel or vertical each other within the plane parallel to the surface of the semiconductor substrate 2. According to this embodiment, since an angle formed by the n-type FinFET 10 and the p-type FinFET 20 can be freely configured by adjusting an angle to laminate the semiconductor substrate 2 and the second semiconductor substrate 5 in the processes for fabricating the semiconductor device 1, it is possible to realize a preferable layout.

In a conventional technique that the plane direction of the fin side surfaces and the channel directions of both n-type and p-type FinFETs are configured to be a direction to improve the carrier mobility by forming n-type and p-type FinFETs disposed on a plane parallel one another to the surface of the semiconductor substrate 2 at a predetermined angle (for example, 45°), problems such that increase of installation area or dimensional control becomes difficult and fabrication processes becomes complicated or the like occur since the layout becomes complicated. However, according to this embodiment, such problems do not occur.

Note that, in general, since an electric current passing through the n-type FinFET is large compared with that of the p-type FinFET, the problem of the deterioration of gate insulating film property by a hot carrier, threshold voltage shift or the like is likely to occur. However, when the oxide film 4 is not formed between the fin 11 of the n-type FinFET 10 and the semiconductor substrate 2 and the fin 11 is connected to the semiconductor substrate 2 with sufficient low resistance just like this embodiment, although a hole is generated in the fin 11 by an impact ionization phenomenon of the hot carrier, the hole can come out to the semiconductor substrate 2 side without remaining therein, therefore, the above-mentioned problems or a substrate floating effect are reduced. On the other hand, since the above-mentioned problems hardly occur in the p-type FinFET 20, there is almost no influence to the operation reliability of the semiconductor device 1 even if the oxide film 4 exists between the fin 21 and the semiconductor substrate 2.

Therefore, the configuration of the semiconductor device 1 according to this embodiment in which the oxide film 4 is not formed between the fin 11 and the semiconductor substrate 2 but is formed between the fin 21 and the semiconductor substrate 2 has a high operation reliability of the semiconductor device 1 compared with the configuration in which the oxide film 4 is not formed between the fin 21 and the semiconductor substrate 2 but is formed between the fin 11 and the semiconductor substrate 2.

Furthermore, in general, it is possible to form the semiconductor device 1 having the above-mentioned effect using the cheapest substrate of which the plane direction of the principal surface is {100} as the semiconductor substrate 2 and the second semiconductor substrate 5.

Second Embodiment

The second embodiment is different from the first embodiment in that the crystal-axis direction of the unit cell of the crystal composing the fin 21 matches that of the crystal composing the semiconductor substrate 2. Note that, for the points which are same as the first embodiments, the explanation will be omitted to simplify.

Figure 5:
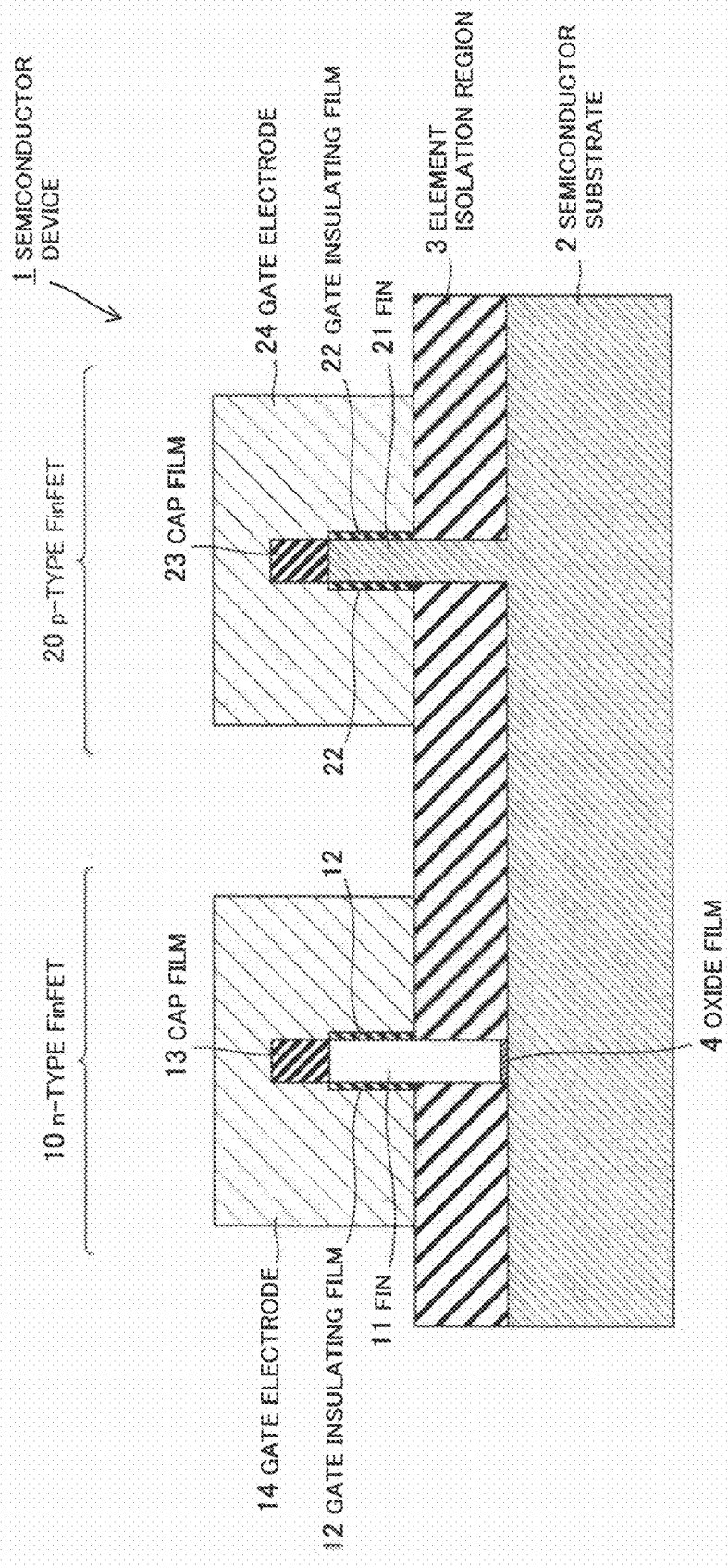
FIG. 5 is a cross sectional view of the semiconductor device according to a second embodiment.

FIG. 5 is a cross sectional view of the semiconductor device according to the second embodiment. Note that, the cross section shown in FIG. 5 corresponds to the cross section shown in FIG. 2.

For the semiconductor substrate 2, it is possible to use, for example, a Si substrate of which plane direction of the principal surface is {100}.

For the fin 21, it is preferable that the plane direction of the side face is {110} and the channel direction 21c of the channel region 21b formed on the side face is <110> for the reason for improving the carrier mobility or the like. Furthermore, the crystal-axis direction of the unit cell of the crystal composing the fin 21 matches that of the crystal composing the semiconductor substrate 2.

For the fin 11, it is preferable that the plane direction of the side face is {100} and the channel direction 11c of the channel region 11b formed on the side face is <100> for the reason for improving the carrier mobility or the like. Furthermore, the oxide film 4 is formed between the fin 11 and the semiconductor substrate 2. The crystal-axis direction of the unit cell of the crystal composing the fin 11 and that of the crystal composing the semiconductor substrate 2 are mismatched at a predetermined angle θ around a direction vertical to the surface of the semiconductor substrate 2. This predetermined angle θ is preferably θ=(45+90×n)° (n is an integer number).

An example of the processes for fabricating the semiconductor device 1 according to this embodiment will be described hereinafter.

FIGS. 6A to 6E are cross sectional views showing processes for fabricating the semiconductor device according to the second embodiment. Note that, the cross sections shown in these figures correspond to the cross section shown in FIG. 5.

Figure 6A:
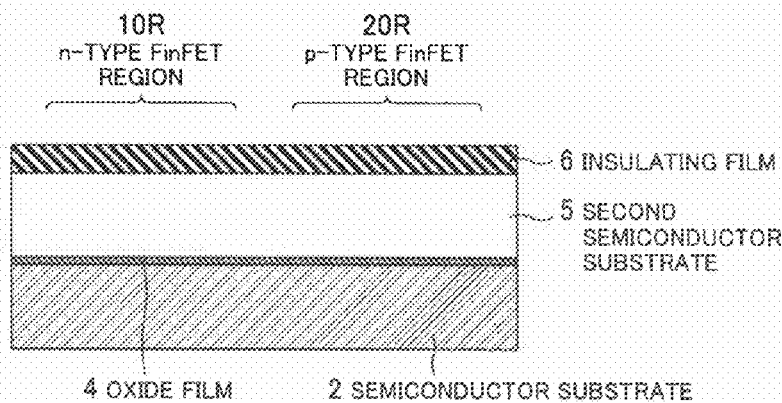
FIGS. 6A to 6E are cross sectional views showing processes for fabricating the semiconductor device according to the second embodiment.

Firstly, as shown in FIG. 6A, the second semiconductor substrate 5 is laminated on the semiconductor substrate 2 and the insulating film 6 is formed thereon. Here, the second semiconductor substrate 5 is composed of, for example, a crystal substantially identical to the crystal composing the semiconductor substrate 2, e.g. an Si crystal. Furthermore, in the second semiconductor substrate 5, the plane direction of the principal surface is equal to that of the semiconductor substrate 2 and the crystal-axis direction of the unit cell is at a predetermined angle θ around a direction vertical to the surface thereof with that of the semiconductor substrate 2. Especially, it is preferable that the plane directions of the principal surfaces of the semiconductor substrate 2 and the second semiconductor substrate 5 are {100} and θ=(45+90×n)° (n is an integer number).

Following method is used for adjusting an in-plane angle of the substrate when laminating the semiconductor substrate 2 and the second semiconductor substrate 5. For example, substrates in which marks indicating directions of the crystal such as notches, orientation flats or the like are provided in a direction preliminarily located at an angle θ to each other are used as the semiconductor substrate 2 and the second semiconductor substrate 5, and are laminated with aligning (matching) the positions of the notches or the like of the semiconductor substrate 2 and the second semiconductor substrate 5. Concretely, it is possible to use a substrate, of which the plane direction of the principal surface is {100} and a notch or the like is formed in a <100> direction of the principal surface, as the semiconductor substrate 2 and a substrate, in which the {100} plane direction of the principal surface is {100} and a notch or the like is formed in a <110> direction of the principal surface, as the second semiconductor substrate 5, and laminate the semiconductor substrate 2 and the second semiconductor substrate 5 with aligning the positions of the notches or the like thereof.

Furthermore, it may use the same substrates, in which the notches or the like are provided in the same direction, as the semiconductor substrate 2 and the second semiconductor substrate 5, and laminate the semiconductor substrate 2 and the second semiconductor substrate 5 with rotating the positions of the notches or the like at an angle θ to each other. Concretely, it is possible to use the substrates, in which the plane directions of the principal surfaces are {100} and a notches are formed in <100> directions or <110> directions of the principal surfaces, as the semiconductor substrate 2 and the second semiconductor substrate 5, and laminate the semiconductor substrate 2 and the second semiconductor substrate 5 with rotating the portions of the notches or the like at 45° to each other. Note that, when conducting a fine alignment of the angle at the time of lamination of both wafers, a method to laminate with aligning the position of the notch of the semiconductor substrate 2 is advantageous.

Figure 6B:
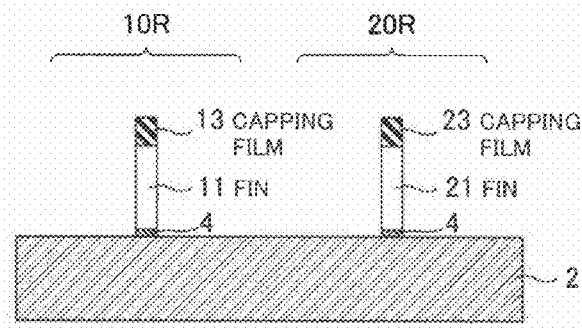

Next, as shown in FIG. 6B, for example, the cap film 13, the fin 11 and the oxide film 4 are formed in the n-type FinFET region 10R and the cap film 23, the fin 21 and the oxide film 4 are formed in the p-type FinFET region 20R, respectively by patterning the insulating film 6, the second semiconductor substrate 5 and the oxide film 4 by photolithography and RIE. Note that, since the oxide film 4 functions as an etching stopper at this time, it is possible to prevent over-etching of the semiconductor substrate 2.

At this stage, both plane directions of the side faces of the fins 11 and 21 are {110} and both channel directions 11c and 21c are <110>. For example, when the substrate, of which the plane direction of the principal surface is {100} and the notch is formed in <110> direction of the principal surface, is used as the second semiconductor substrate 5, the fins 11 and 21 are formed to be parallel in a direction of the notch of the second semiconductor substrate 5.

Figure 6C:
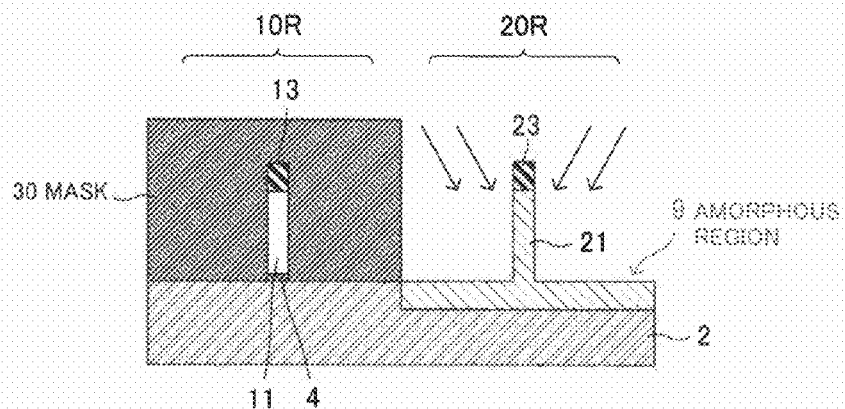

Next, as shown in FIG. 6C, after forming the mask 30 on the n-type FinFET region 10R, an impurity is selectively implanted to the p-type FinFET region 20R and the area where the impurity has been implanted is amorphized, which results in that an amorphous region 9 is formed.

Figure 6D:
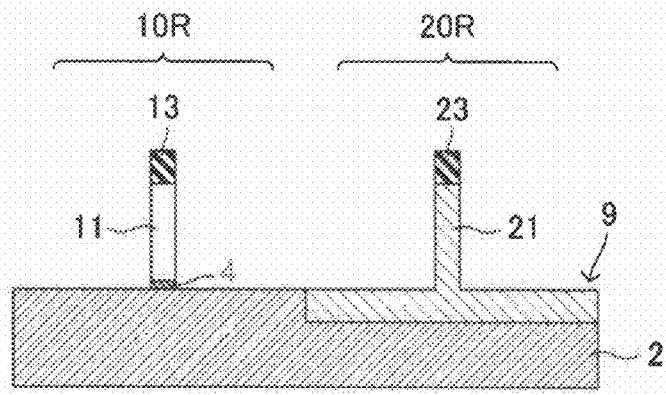

Next, as shown in FIG. 6D, the mask 30 on the n-type FinFET region 10R is removed.

Figure 6E:
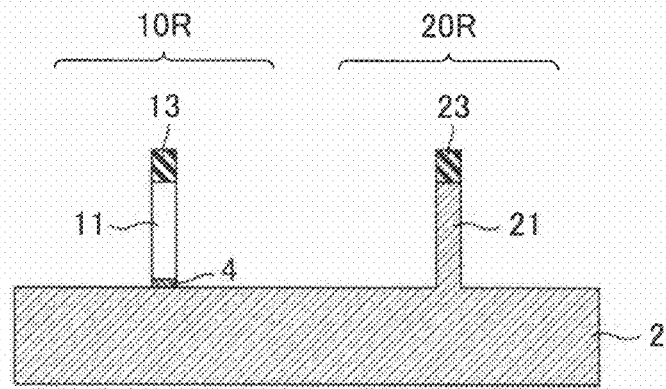

Next, as shown in FIG. 6E, the amorphous region 9 is recrystallized by annealing treatment. Here, since the recrystallization occurs using the semiconductor substrate 2 as a base, the crystal-axis direction of the unit cell of the crystal of the fin 21 matches that of the semiconductor substrate 2. Note that, as shown in FIG. 6E, it is preferable that the oxide film 4 in the p-type FinFET region 20R is destroyed and the region where the oxide film 4 was formed is recrystallized during the above-mentioned formation of the amorphous region 9 and a series of processes for recrystallizing.

After that, a process following the formation process of the device isolation region 3 shown in FIG. 4F is carried out in a same way as the first embodiment.

According to the second embodiment, it is possible to obtain an effect similar to the first embodiment by the semiconductor device 1 having a configuration different from the first embodiment. Note that, since oxide film 4 is formed between the fin 11 and the semiconductor substrate 2, the electron hole generated in the fin 11 by the impact ionization phenomenon of the hot carrier cannot come out to the semiconductor substrate 2 side and the operation reliability of the semiconductor device 1 is possibly inferior to that of the first embodiment, however, it is acceptable as long as this problem due to the impact ionization phenomenon of the hot carrier is an application at a level that the operation reliability of the semiconductor device 1 is not really affected.

Third Embodiment

The third embodiment is different from the first embodiment in a part of the method for fabricating the semiconductor device 1. Note that, for the points which are same as the first embodiments, the explanation will be omitted to simplify.

An example of the processes for fabricating a semiconductor device 1 according to this embodiment will be described hereinafter.

Figure 7A:
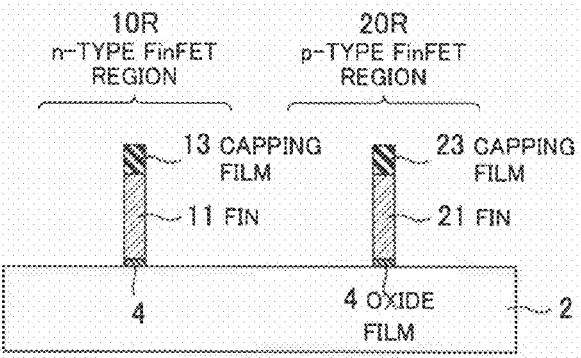
FIGS. 7A to 7C are cross sectional views showing processes for fabricating the semiconductor device according to a third embodiment.
Figure 7B:
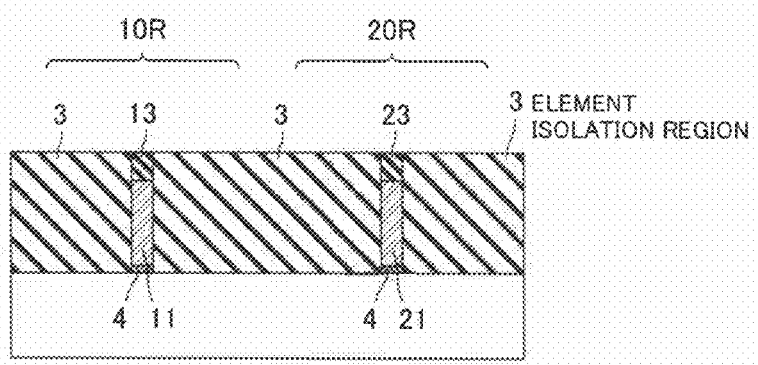
Figure 7C:
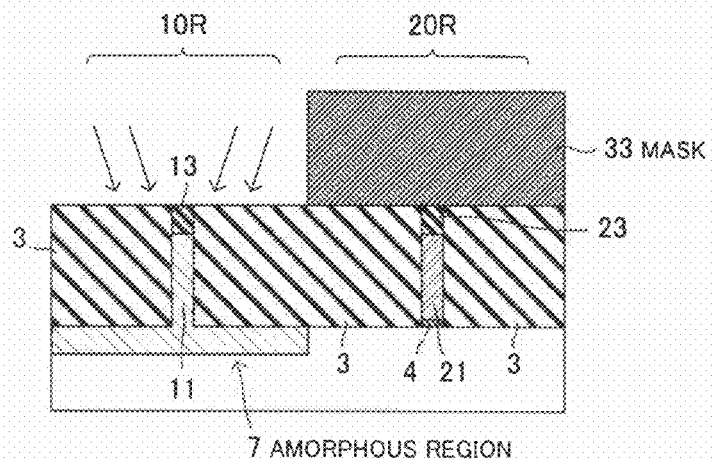

FIGS. 7A to 7C are cross sectional views showing processes for fabricating the semiconductor device according to the third embodiment. Note that, the cross sections shown in these figures correspond to the cross section shown in FIG. 2.

Firstly, as shown in FIG. 7A, the processes forming the cap film 13, the fin 11 and the oxide film 4 in the n-type FinFET 10, and the processes forming the cap film 23, the fin 21 and the oxide film 4 in the p-type FinFET 20 are carried out in the same way as the first embodiment.

Next, as shown in FIG. 7B, after depositing a $SiO_2$ film or the like by the CVD method or the like, the device isolation region 3 is formed by planarizing this deposited film by the CMP using the upper surface of the cap films 13 and 23 as a stopper.

Next, as shown in FIG. 7C, after forming a mask 33 on the p-type FinFET region 20R, an impurity is selectively implanted to the n-type FinFET region 10R and the area where the impurity has been implanted is amorphized via the device isolation region 3 of the semiconductor substrate 2, which results in that an amorphous region 7 is formed.

Following this, by removing the mask 33 on the p-type FinFET region 20R and recrystallizing the amorphous region 7 by the annealing treatment, the status becomes same as shown in FIG. 4F. Here, since the recrystallization occurs using the semiconductor substrate 2 as a base, the crystal-axis direction of the unit cell of the crystal of the fin 11 matches that of the semiconductor substrate 2.

After this, the process following the etch back process of the device isolation region 3 shown in FIG. 4G is carried out in the same way as the first embodiment.

According to the third embodiment, since the side face of the fin 11 is covered by the device isolation region 3, although the fin 11 is thin and has a risk to be damaged or destroyed as being unsustainable against the damage by the impurity implantation for forming the amorphous region 7, it is possible to hold the fin 11 by the device isolation region 3 when forming the amorphous region 7. Note that, since the damage is repaired by recrystallizing, there is no risk of the damage or destruction after the recrystallization.

Obviously, this embodiment can be combined with the second embodiment, and in this case, the device isolation region 3 is to be a support of the fin 21 when amorphizing the fin 21.

Fourth Embodiment

The fourth embodiment is different from the first embodiment in that strain generating films 15 and 25 for generating a strain in the channel regions 11b and 21b of the n-type FinFET 10 and the p-type FinFET 20 are formed. Note that, for the points which are same as the first embodiments, the explanation will be omitted to simplify.

Figure 8:
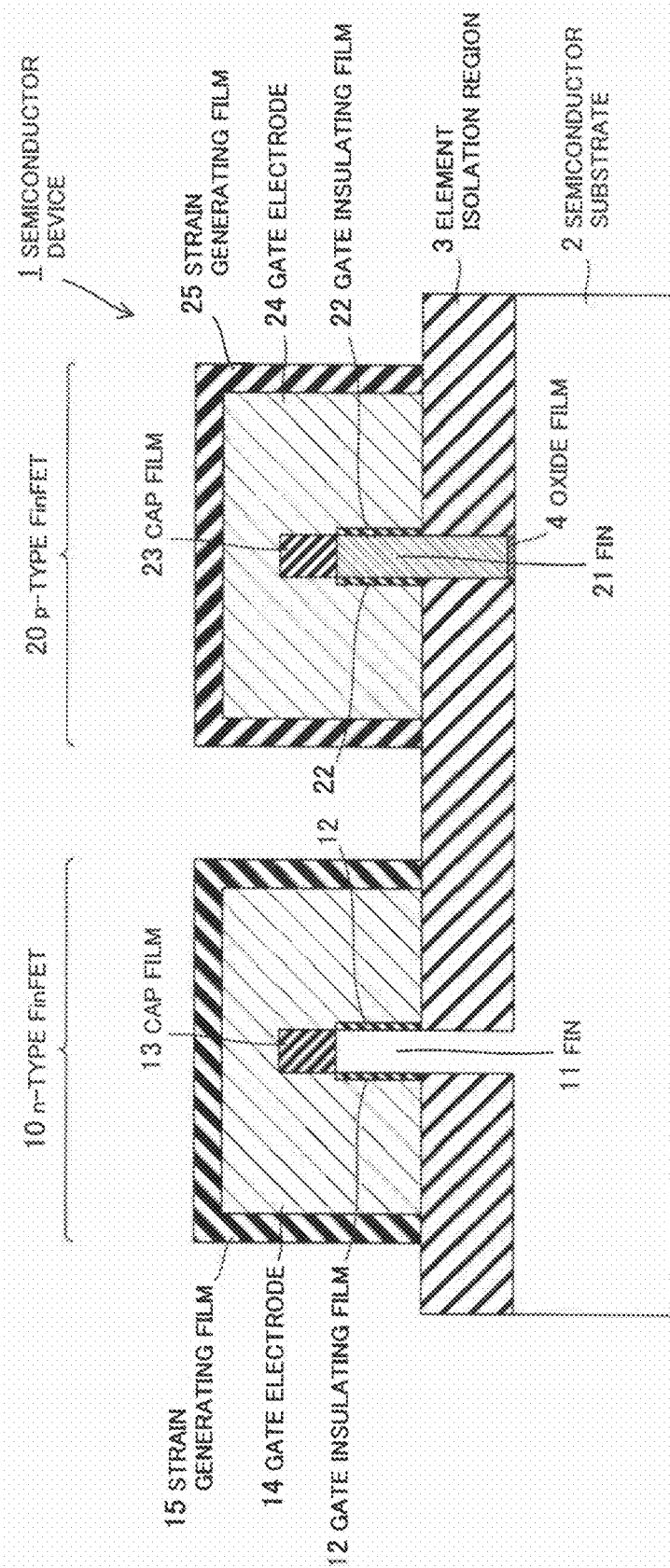
FIG. 8 is a cross sectional view of a semiconductor device according to a fourth embodiment.

FIG. 8 is a cross sectional view of the semiconductor device according to the fourth embodiment. Note that, the cross section shown in FIG. 8 corresponds to the cross section of the semiconductor device 1 of the first embodiment shown in FIG. 2.

The strain generating film 15 is formed so as to cover the whole n-type FinFET 10 and has a function to improve the mobility of the electron by generating a strain in the channel region 11b in the fin 11. The strains generated in the channel region 11b by the strain generating film 15 are specifically a tensile strain in the channel direction, a compressive strain in a height direction of the fin 11 and a compressive strain in a thickness direction of the fin 11.

These strain properties (compressive or tensile) match the property of the strain to improve the mobility of the electron of the channel region 11b in any directions when the plane direction of the side face of the fin 11 is {100} and the channel direction is a <100> direction in the {100} plane.

The strain generating film 25 is formed so as to cover the whole p-type FinFET 20 and has a function to improve the mobility of the electron hole by generating a strain in the channel region 21b in the fin 21.

The strain generating film 25 has a property to generate a strain, which has the opposite property to that of the strain generating film 15, in an object and the strains generated in the channel region 21b by the strain generating film 25 are specifically a compressive strain in the channel direction, a tensile strain in a height direction of the fin 21 and a tensile strain in a thickness direction of the fin 21.

These strain properties (compressive or tensile) match the property of the strain to improve the mobility of the electron hole of the channel region 21b in any directions when the plane direction of the side face of the fin 21 is {110} and the channel direction is a <110> direction in the {110} plane.

Namely, it is preferable to form the fin 11 so that the plane direction of the side face is {100} and the channel direction is a <100> direction in the {100} plane, and to form the fin 21 so that the plane direction of the side face is {110} and the channel direction is a <110> direction in the {110} plane from the viewpoint of improvement of the carrier mobility by the strain generating films 15 and 25.

Note that, for example, when the fin 11 is formed so that the plane direction of the side face is {110} and the channel direction is a <100> direction in the {110} plane just like the fin 21, the properties of the strain to improve the mobility of the electron are a tensile strain in the channel direction, a compressive strain in a height direction of the fin 11 and a tensile strain in a thickness direction of the fin 11, and the strain in the thickness direction of the fin 11 does not match the property of the strain actually generated. As a result, there is a risk that the mobility of the electron is reduced compared with the above-mentioned preferable case.

For the strain generating films 15 and 25, it is possible to use a SiN film formed by the CVD method or the like. In this case, it is possible to form the strain generating films 15 and 25 separately by adjusting the level of the strain generating in the object and the properties (compressive or tensile) by controlling hydrogen concentration in the SiN film.

Furthermore, the strain generating films 15 and 25 can be used as an etching stopper when etching an interlayer insulating film (not shown) formed on the strain generating films 15 and 25 to form a contact plug (not shown) or the like.

According to the fourth embodiment, it is possible to improve the carrier mobility of the channel regions 11c and 21c and, as a result, improve current characteristics of the n-type FinFET 10 and the p-type FinFET 20 by forming the strain generating films 15 and 25.

Furthermore, as shown in the first embodiment, since it is possible to form the fins 11 and 21 varying the channel direction with respect to the crystal axis, it is possible to match the property of the strain generated from the strain generating films 15 and 25 with the property of the strain to improve the carrier mobility in the fins 11 and 21. As a result, it is possible to obtain the effect to improve the carrier mobility more effectively for both of the n-type FinFET 10 and the p-type FinFET 20.

Furthermore, as shown in the first embodiment, since the fins 11 and 21 can be formed parallel or vertical to each other, it is possible to form the strain generating films 15 and 25 relatively easily. For example, when the fins 11 and 21 are formed within the plane parallel to the surface of the semiconductor substrate 2 at an angle of 45° one another, the layout of the strain generating films 15 and 25 becomes complicated, which occurs the problems such that the formation of the strain generating films 15 and 25 becomes difficult or the like.

Other Embodiments

It should be noted that embodiments are not intended to be limited to the above-mentioned first to fourth embodiments, and the various kinds of changes thereof can be implemented by those skilled in the art without departing from the gist of the invention. For example, it is possible to lower electric resistivity by epitaxially growing a crystal such as Si or the like on the surface of the fins 11 and 21 to increase the thickness of the fins 11 and 21. Note that, when epitaxially growing a crystal having a lattice constant different from that of Si such as a SiGe crystal, a SiC crystal or the like, it is possible to improve the carrier mobility by generating an appropriate strain in the channel regions 11b and 21b of the fins 11 and 21.

Furthermore, in the above-mentioned first to fourth embodiments, although it is explained that the plane directions of the principal surface of the semiconductor substrate 2 and the second semiconductor substrate 5 are {100}, the plane direction of the principal surface thereof is not limited thereto, for example, it may be {110}.

Furthermore, it is possible to arbitrarily combine the configurations of the above-mentioned first to fourth embodiments without departing from the gist of the invention.

Furthermore, the embodiments include the semiconductor device having following structure.

A semiconductor device comprising a semiconductor substrate, a first transistor formed on the semiconductor substrate comprising a crystal of which axial angle is substantially identical to that of the semiconductor substrate, which has a first fin of which crystal-axis direction of the unit cell substantially matches that of the semiconductor substrate, and a second transistor formed on the semiconductor substrate comprising a crystal of which axial angle is substantially identical to that of the semiconductor substrate, which has a second fin in which the crystal-axis direction of the unit cell thereof is at a predetermined angle around a direction vertical to the surface of the semiconductor substrate with that of the semiconductor substrate.

A semiconductor device comprising a semiconductor substrate in which one of crystal axes of the unit cell faces to a direction vertical to the surface of the semiconductor substrate and two of them face to a direction along the plane parallel to the surface of the semiconductor substrate, a first transistor formed on the semiconductor substrate comprising a crystal of which axial angle is substantially identical to that of the semiconductor substrate, which has a first fin of which crystal-axis direction of the unit cell is substantially identical to that of the semiconductor substrate, and a second transistor formed on the semiconductor substrate comprising a crystal of which axial angle is substantially identical to that of the semiconductor substrate, which has a second fin in which one of crystal axes faces to a direction vertical to the surface of the semiconductor substrate and two of them face to a direction different from the crystal-axis direction of the unit cell of the semiconductor substrate along the plane parallel to the surface of the semiconductor substrate.

What is claimed is:

1. A semiconductor device, comprising:
    a semiconductor substrate;
    a first transistor formed on the semiconductor substrate and having a first fin; and
    a second transistor formed on the semiconductor substrate and having a second fin of which plane direction of the upper surface is identical to that of the first fin, a channel direction in the second fin with respect to a crystal axis of the side surface portion of the second fin being different from a channel direction in the first fin with respect to a crystal axis of the side surface portion of the first fin, and a direction in which the second fin is arranged being substantially parallel or vertical to a direction in which the first fin is arranged within a plane parallel to a surface of the semiconductor substrate.

2. The semiconductor device according to claim 1, wherein the first transistor is an n-type transistor in which the plane direction of the side face of the first fin is {100} and the channel direction is a <100> direction of the {100} plane; and
    the second transistor is a p-type transistor in which the plane direction of the side face of the second fin is {110} and the channel direction is a <110> direction of the {110} plane.

3. The semiconductor device according to claim 2, wherein the crystal-axis direction of the unit cell of the semiconductor substrate substantially matches that of the first fin.

4. The semiconductor device according to claim 2, wherein the first and second transistors are n-type and p-type transistors, respectively; and
    an oxide film is formed between the second fin and the semiconductor substrate but is not formed between the first fin and the semiconductor substrate.

5. The semiconductor device according to claim 1, wherein the semiconductor substrate and the first and second fins are formed of crystals of which axial angles are substantially identical to each other; and
    a crystal-axis direction of the unit cell of the first fin and that of the second fin are located at $(45 + 90 \times n)°$ (n is an integer number) around a direction vertical to a surface of the semiconductor substrate to each other.

6. The semiconductor device according to claim 1, wherein the crystal-axis direction of the unit cell of the semiconductor substrate substantially matches that of the first fin.

7. The semiconductor device according to claim 1, wherein the semiconductor substrate and the first and second fins are formed of crystals of which axial angles are substantially identical to each other;
   the semiconductor substrate has crystal axes of the unit cell, one of the crystal axes of the unit cell of the semiconductor substrate facing to a direction vertical to the surface of the semiconductor substrate, two of them being along a plane parallel to the surface of the semiconductor substrate;
   the crystal-axis direction of the unit cell of the semiconductor substrate substantially matches that of the first fin; and
   the second fin has crystal axes of the unit cell, one of the crystal axes of the unit cell of the second fin facing to a direction vertical to the surface of the semiconductor substrate, two of them being along a plane parallel to the surface of the semiconductor substrate and facing to directions mismatched with the crystal-axis direction of the unit cell of the semiconductor substrate.

8. The semiconductor device according to claim 1, wherein the first and second transistors are n-type and p-type transistors, respectively; and
   an oxide film is formed between the second fin and the semiconductor substrate but is not formed between the first fin and the semiconductor substrate.

9. The semiconductor device according to claim 1, wherein first and second strain generating films for generating a strain in each channel regions of the first and second transistors are formed on the first and second transistors.

* * * * *